(12) United States Patent
Sykora et al.

(10) Patent No.: US 12,051,578 B2
(45) Date of Patent: Jul. 30, 2024

(54) CONNECTION OF HIGH-PERFORMANCE PULSE DISCHARGE PLASMA GENERATOR, ESPECIALLY FOR MAGNETRON SPUTTERING

(71) Applicant: Slovenka Technicka Univerzita V. Bratilasve, Bratislava (SK)

(72) Inventors: Roman Sykora, Trnava (SK); Jan Sykora, Trnava (SK); Lubomir Caplovic, Bratoslava (SK); Jana Bohovicova, Zavar (SK); Marcel Mesko, Dolny Hricov (SK)

(73) Assignee: Slovenka Technicka Univerzita V. Bratilasve, Bratislava (SK)

( * ) Notice: Subject to any disclaimer, the term of this patent is extended or adjusted under 35 U.S.C. 154(b) by 166 days.

(21) Appl. No.: 17/906,068

(22) PCT Filed: Mar. 10, 2021

(86) PCT No.: PCT/IB2021/051982
§ 371 (c)(1),
(2) Date: Sep. 10, 2022

(87) PCT Pub. No.: WO2021/181295
PCT Pub. Date: Sep. 16, 2021

(65) Prior Publication Data
US 2023/0124940 A1    Apr. 20, 2023

(30) Foreign Application Priority Data

Mar. 10, 2020 (SK) ........................................ 20-2020
Mar. 10, 2020 (SK) .................................... 30-2020 U

(51) Int. Cl.
*H01J 37/34* (2006.01)

(52) U.S. Cl.
CPC ...... *H01J 37/3444* (2013.01); *H01J 37/3405* (2013.01); *H01J 37/3467* (2013.01)

(58) Field of Classification Search
CPC ............... H01J 37/3444; H01J 37/3405; H01J 37/3467; H01J 37/32944; C23C 14/3485
See application file for complete search history.

(56) References Cited

U.S. PATENT DOCUMENTS

| 2004/0124077 A1 | 7/2004 | Christie |
| 2011/0038187 A1 | 2/2011 | Horishita |

(Continued)

FOREIGN PATENT DOCUMENTS

| CN | 204442196 | 7/2015 | |
| WO | WO-2013146655 A1 * | 10/2013 | ........... C23C 16/511 |
| WO | WO2017003339 | 1/2017 | |

*Primary Examiner* — Abdullah A Riyami
*Assistant Examiner* — Syed M Kaiser
(74) *Attorney, Agent, or Firm* — Defillo & Associates, Inc.; Evelyn A. Defillo

(57) ABSTRACT

Connection includes transistor, transistor exciter controlled by the frequency generator and/or programmable unit, the power source of voltage, the unit with capacitors. The voltage power source is connected to the transistor through the unit with capacitors. The stabilizing non-inductive resistor is connected to the power supply branch for the magnetron with transistor. The power stabilizing non-inductive resistor is a resistor with the wire wound by Ayrton-Perry-type winding and/or the resistor with low value of the parasitic inductance on the basis of thin layers. The electronic control circuits of the gate of the transistor include a frequency generator with the cut-off switch and with support elements and also include an exciter with support elements. The connection with the stabilizing non-inductive resistor is used in case of the bipolar and/or multi-circuit pulse plasma generator. The depolarization voltage is led from the outside source through the capacitor to the depolarization block.

18 Claims, 10 Drawing Sheets

(56) References Cited

U.S. PATENT DOCUMENTS

2016/0237554 A1 8/2016 Kadlec et al.
2018/0108519 A1 4/2018 Babayan

* cited by examiner

CONNECTION OF HIGH-PERFORMANCE PULSE DISCHARGE PLASMA GENERATOR, ESPECIALLY FOR MAGNETRON SPUTTERING

CROSS REFERENCE TO RELATED APPLICATION

This application is a national stage entry of PCT/162021/051982 filed Mar. 10, 2021, under the International Convention claiming priority over Slovakia Patent Application No. SK PP 20-2020 filed Mar. 10, 2020 and Slovakia Patent Application No. SK PUV 30-2020 filed Mar. 10, 2020.

FIELD OF TECHNOLOGY

The invention concerns a connection of high-performance pulse discharge of a pulse plasma generator with a stabilization, mainly for magnetron sputtering. The invention falls within the field of electrotechnology and preparation of thin layers and films by means of magnetron sputternig.

PRIOR STATE OF THE ART

Magnetron sputtering is one of the most common methods of preparation of thin layers with specific features, suitable for the industrial applications. High-performance impulse magnetron sputtering (HiPIMS) is an energetically heightened form of sputtering, during which the material sputtered from the target is subjected to a very high density of pulse discharge, during which a high density of electrons is produced in plasma, which leads to ionization of a specific amount of sputtered particles with energy in a hyperthermal scope (1 to 100 eV). The burning discharge causes a bombardment of the cathodes by positive ions and creation of metal gases which subsequently condense on the anode and form a thin metal layer.

The surface of the growing thin layers and films is bombarded by ions and in such energetic scope it is subjected to the processes of separation of an atom, including fragmentation of the three-dimensional clusters and their total fragmentation into adatoms, which leads to dense microstructure of thin layers and films without pores and cavities with a smooth surface. In technological processes using HiPIMS for the application of the decorative or hard, solid films, the standard method for the suppression of an arc can suffice to prevent or limit the damaging of the target and allows for an appropriate deposition quality, especially when the conditions of discharge pulsing are carefully selected in order to prevent or limit its frequent occurrence or suppression of its appearance. However, in case of processes sensitive to the presence of the drops such as deposition of the thin layers or films onto semiconductor circuit boards, for preparation of 2D materials, MEMS and thin layers and films for optical or magnetic storage of data, the residual energy led into an arc can be too large. The drops emitted from the arcs during deposition can cause a damage of some devices produced on the silicon board or other substrate. Even worse problem is their accumulation in a deposition chamber or their increased creation, for example, during the installation of a new target. Such targets often show much larger tendency towards an arc as older, eroded targets. The drops accumulated in this matter can be released from the walls of the deposition chamber later during the production processes, and even when the production of the arc does not take place during the process itself (Kadlec et al. US 2016/0237554 A1). In case an arc appears, the impedance of the discharge decreases sharply. This causes a sharp increase of the current. In case the presence of the arc is determined by one of the well-known techniques, for example after exceeding a threshold current, the switch is instantly set into an off position with a temporal delay limited by the electronics and switch element used. However, the energy stored in the input conductor and the preceding coil can still be relatively large for creation of subsequent arcs (Kadlec et al. US 2016/0237554 A1) and must be led away (Christie. US 2004/0124077 A1). The efficacy of the abovementioned methods of suppression of the arc is dependent on the temporal constant of the electric circuits whose goal is to determine the presence of an arc and to lead away the surplus amount of energy. This is why these sorts of techniques for suppression of an arc may not be suitable for most deposition processes related to the preparation of the thin layers and films sensitive to the presence of drops. This is why it is preferable to consider a decrease in the parasitic inductance, mainly in connecting wires or cables (BABAYAN et al. US 2018/0108519 A1).

The use of additional resistor for the stabilization of the discharge is commonly known in case of a one-way discharge, where $di/dt=0$ and where parasitic inductance of the resistor plays no role. The use of stabilizing resistor is also obvious. The situation is, however, different in case of the pulse discharge where the values of $di/dt$ can be high. Due to the presence of parasitic inductance in the circuit the large change of the current $di/dt$ will produce additional voltage $L.di/dt$ and thereby decrease the stability of the voltage and subsequently of the current in the discharge, too, mainly during the switching of the discharge on and off, since it is a pulse discharge.

The presence of noises or undesired oscillations in the voltage and current affects the stability of the plasma negatively, which subsequently leads to a transition from the glow discharge to the undesired arc discharge. This problem arises even with bipolar or multi-circuit pulse plasma generators. A new connection of the control and charging of the magnetron is thus desired, which will address this deficiency.

SUMMARY OF THE INVENTION

The problem with a sufficient stabilization of the high-performance pulse discharge of the pulse plasma generator can be solved in such a way that the inductive ballast is substituted by a purely resistance ballast even at the cost of some part of energy dispersing in it and getting lost, which means it will not be led into the discharge. This will result in the connection for the generation of the stable high-performance pulse discharge by means of the pulse plasma generator for the magnetron sputtering as disclosed in the proposed invention.

The deficiencies in the prior state of art are significantly remedied by the connection of the plasma generator of the high-performance pulse discharge, mainly for the magnetron sputtering, where the connection includes a transistor, a transistor exciter (driver) controlled by the generator and/or programmable unit, a power voltage source, a unit with capacitances, whereby the power voltage source is connected with the transistor through the unit with capacitances, according to this invention, which essence lies in the fact that into the power supply branch of the magnetron with transistor a power stabilizing non-inductive resistor is included.

The term "non-inductive resistor" means that the resistor has low value of parasitic inductance—preferably zero value, which, however, cannot be achieved physically. The term "non-inductive resistor" therefore denotes a resistor whose construction is intentionally designed for the maximal suppression of inductance. Preferably, a resistor with a wound wire with Ayrton-Perry-type winding will be used as stabilizing non-inductive resistor. A resistor with low value of parasitic inductance on the basis of thin layers can be used, too.

In both alternative realizations the impedance value of power stabilizing non-inductive resistor can be basically the same as impedance of the glow discharge in the metal gases or it can be more than the impedance of the glow discharge in the metal gases.

It is preferable of the power stabilizing non-inductive resistor is inserted at the end of the branch designed for the connection to the magnetron.

In the connection there, further, electronic control circuits connected to the transistor gate. The first branch of resistors (R9 and R10 one after another) and capacitor (C4) is inserted between the source electrode and drain electrode of the transistor. The second branch is inserted in parallel between the source electrode and drain electrode of the transistor and it includes a diode (D3). The third branch is inserted parallel to the first and second branch and it includes two surge diodes. A compensation capacitances and compensation resistors are inserted between the positive and negative clip of the power supply, behind the protective resistor (R17). In the power supply branch of the magnetron there can be, on one side, a protective diode, diode (D4), stabilizing resistors and on the other side a resistor (R11) connected to the negative clip of the power supply.

The connection is completed by electronic control circuits of the IGBT gate of NMOS transistor which are formed by a frequency generator with the cut-off switch with its support components and IGBT exciter (driver) with its support components. Between the frequency generator and IGBT exciter there can be a changeover switch with a second input for the programmable unit.

In the preferable, improved realization the power voltage is led from the outside source into the generator onto a block of capacitors (CE1-CE4) through the diode (D4) and protective resistor (R18). The diode and the resistor protect the source against sudden voltage changes so that no overshoots appear on the voltage regulator. The capacitors are connected in parallel series. The DC voltage is brought from there to the entry to the power block. The voltage is switched by power IGBT transistors (IGBT1 and IGBT2) either pursuant to the TTL signal from its own frequency generator or from the external source of TTL signal led in through the exciter. IGBT transistors are protected at the input (ZD2) and also output (Transit 3) against pulse surge. A voltage is led to the magnetron through the stabilizing non-inductive resistors (R12 and R13). The power level before short-term pulse short-circuits is protected by the snubber (R10, 11+C4).

The mentioned principle of the connection with the stabilizing non-inductive resistor can be sued in case of bipolar and/or multi-circuit pulse plasma generator, too, mainly for magnetron sputtering.

In case of bipolar sputtering, the reverse depolarization pulse follows after the performance power pulse in order to remove all accumulated charge on the surface of the electrode. Such method of sputtering improves the quality of the sputtered layer significantly.

In case of bipolar pulse plasma generator, the power voltage from the outer source is led through the block of capacitors CE1 and CE2 into the power block. Stability of their voltages is ensured by resistors R1 and R2. Depolarization voltage is led from the outer source through the capacitor CE3 into the depolarization block. The voltages are switch by power IGBT transistors, IGBT1 and IGBT2, pursuant to TTL signal from its own frequency generator, led in through the exciter. The power level is protected against short-term pulse short-circuits by snubber with resistors and capacitor. Voltage is led to the magnetron through the stabilizing non-inductive resistor.

The multi-circuit pulse plasma generator allows to produce a film of multiple various substrates at the same time, or subsequently, by subsequent switching of the generators, it can produce multi-layer films.

Power voltage is led from the outside source onto the blocks of capacitors through the separation diodes. The diodes ensure mutual independence of all power circuits. Thanks to them, only one source of power supply suffices for the connection of all circuits. The stability of the voltages on the capacitors is ensure by the division resistors. The voltages are switch by power IGBT transistors pursuant to the TTL signal from its own or from the external frequency generator. Each power level is protected against the short-term pulse short-circuits by snubber R1, R2+C1; R3, R4+C2 and R5, R6+C3, etc., pursuant to the number of circuits. Voltage is led to the magnetron through non-inductive stabilization resistors R13-R18.

IGBT transistors of "High speed 3 technology" class with high switching speed can be used for switching of the power voltage. This IGBT transistor is resistant against the interference as well as short-term short-circuits. Power stabilizing non-inductive resistors with Ayrton-Perry-type winding were used for the stabilization of the plasma discharge.

Each circuit can be equipped by connectors for the connection of the oscilloscope. This allows for direct and undistorted measurement of all necessary values without the need for measuring probes and separate source for the oscilloscope. Thanks to this the operation costs diminish.

Applications with pulse plasma generators according to this invention ensure a high quality of the films, thin layers, by means of optimal structure and even covering on the complexly shaped substrates. For a larger variation of the processes of sputtering it is possible to connect an external control generator TTL (Transistor-Transistor Logic) for the pulses. This can synchronize and control all pulses, their lengths and phase shift.

The advantages of the connection of the stabilization of the high-performance pulse discharge of the pulse plasma generator for the magnetron sputtering according to this invention are obvious from the effects of said inventions, in which it manifests itself outwardly. The effects of this invention lie mainly in the fact that it suppresses the variance of the voltage and magnetron current and prevents the transition into the arc discharge. According to this invention, the temporal development of the voltage and the current of the magnetron discharge after the initial ignition phase is constant, which ensures its stability.

The comparison of the connection according to this invention and the connections in the prior art is focused on the presence of noises and other undesired oscillations in the voltage and current, and it has proven that the subject matter of the invention shows low amount of oscillation, low level of noise and high level of stability of the voltage and the current.

DESCRIPTION OF DRAWINGS

The invention is further disclosed in drawings 1 to 16.

EXAMPLES OF REALIZATION

It is understood that individual realizations of connection of the stabilization of the high-performance pulse discharge plasma pulse generator for magnetron sputtering according to this technical solution are presented for illustration purposes only and not as limitations of technical solutions. A person skilled in the art will find or will be able to find, by using no more than routine experimentation, many equivalents to the specific realizations of the technical solution. Such equivalents will then likewise fall within the scope of the subsequent patent claims.

A choice of suitable materials and dimensioning for the features not analysed in detail here will not be a problem for a person skilled in the art.

EXAMPLE 1

Figure 1:
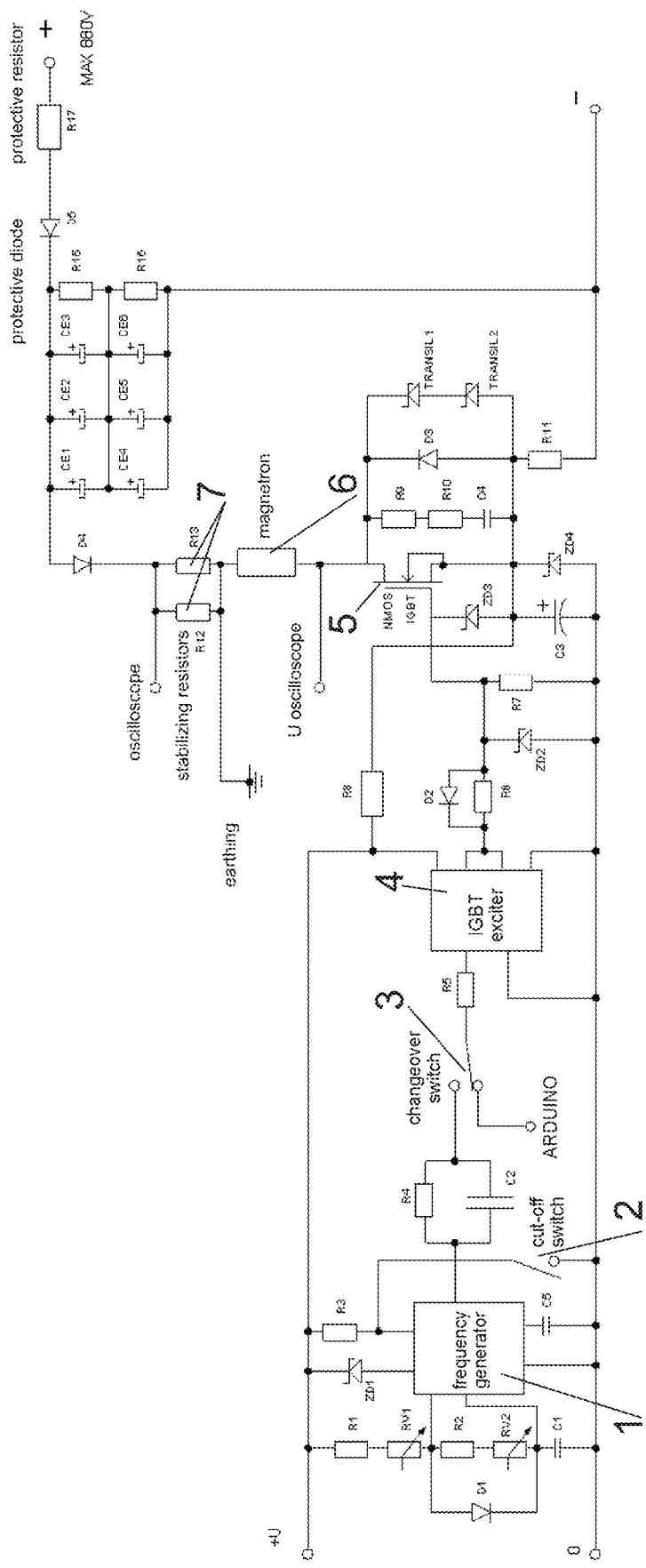
FIG. 1 shows a schema of connection of high-performance pulse discharge plasma pulse generator for magnetron sputtering according to the first example of the realization of invention.
Figure 2:
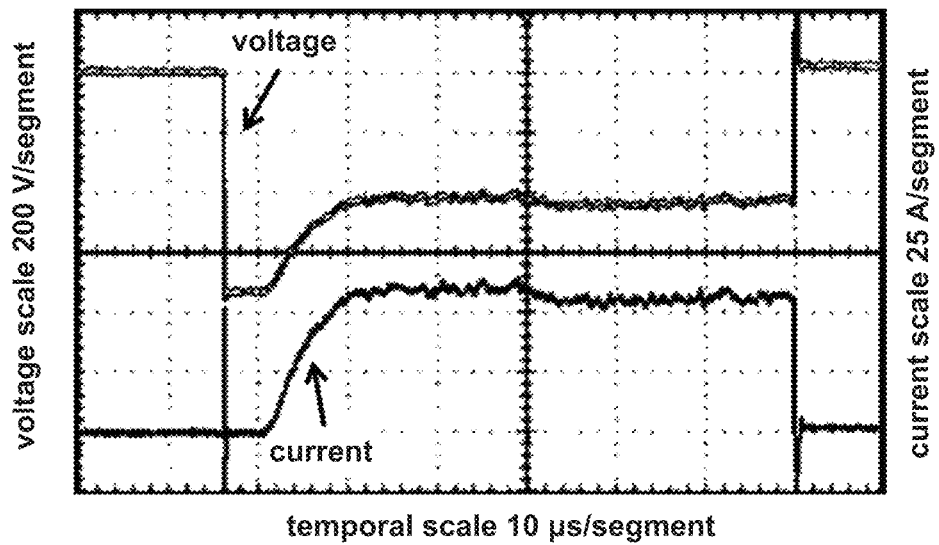
FIG. 2 depicts a time graph of course of voltage and current of the magnetron discharge of the device according to the example 1.

In this example of particular realization of the invention a connection of the high-performance pulse discharge plasma pulse generator for magnetron sputtering, as disclosed on the FIGS. 1 and 2, is disclosed.

The basis of the connections is magnetron 6 with NMOS transistor 5. Subsequently, a stabilizing non-inductive resistor 7 (R12, R13) with low value of parasitic inductance and wound by the wire with Ayrton-Perry-type winding is inserted into the power supply branch of the magnetron 6 with NMOS transistor 5, whereby the impedance value of the stabilizing non-inductive resistor 7 is equal to the impedance of the glow discharge in the metal gases. FIG. 2 shows a graph of temporal course of the voltage and current during magnetron discharge of the respective device construed on the basis of the proposed invention. Electronic control circuits of the IGBT gate of the NMOS transistor 5 are connected to the IGBT gate of the NMOS transistor 5, whereby these circuits are formed by the frequency generator 1 with the cut-off switch 2 and support elements and by IGBT exciter 4 with the support elements, among which there is inserted a changeover switch 3 with second input for the programmable unit, in this example on the ARDUINO platform.

Three parallel branches are inserted between the source electrode and drain electrode of the NMOS transistor 5. In the first branch there are resistor R9, resistor R10 and capacitor C4 in the series. In the second branch there is only diode D3. In the third parallel branch there are two overvoltage diodes TRANSIL1 and TRANSIL2 in the series. Compensation capacitors CE1 to CE6 and compensation resistors R15 and R16 are inserted behind the protective resistor R17, between the positive and negative power supply clip.

A protective diode D5, diode D4 and stabilization resistors R and resistor R11 are connected on the negative clip of the power supply in the power supply branch of the magnetron 6. An earthing is led from the connecting line between stabilizing non-inductive resistors 7 (R12 and R13) and magnetron 6. A voltage output for the oscilloscope is led from the drain electrode of the NMOS transistor 5. The current output for the oscilloscope is led from the connecting line between the stabilizing non-inductive resistors (R12 and R13) and diode D4.

The core of the frequency generator 1 in this example is NE555 circuit with support elements connected in such a way that the zero clip 0 of the power supply is connected to the second and sixth pin of the circuit through the capacitor C1; it is connected directly to the first pin and the fifth pin of the circuit to the capacitor C5. The positive clip+U of the power supply is connected to the seventh pin of the circuit through the resistor R1 and regulation resistor RV1; and to the eighth pin of the circuit through the Zener diode ZD1 and to the fourth pin of the circuit through the resistor R3. A cut off switch 2 is inserted between the fourth pin of the circuit and zero clip 0 of the power supply. Resistor R2 and regulation resistor RV2 is connected in series between the seventh and, at the same time, sixth and second pin of the circuit; the diode D1 is connected in parallel. The fourth pin of the circuit is connected with the zero clip 0 of the power supply through the cut-off switch 2. The third pin is led onto the first input of the changeover switch 3 through the parallel combination of the resistor R4 and capacitor C2. The output of the changeover switch 3 is connected to the second pin of the IGBT exciter 4 through the resistor R5.

The core of the IGBT exciter 4 in this example is TLP 250 or HCPL 3120 circuit with supplementary elements connected in such a way that the eighth pin of the IGBT exciter 4 is connected to the positive clip+U of the power supply; the third and fifth pin of the IGBT exciter 4 is connected to the zero clip 0 of the power supply. The sixth and seventh pin of the IGBT exciter is connected through the parallel combination of the diode D2 and resistor R6 connected to the IGBT gate of the NMOS transistor 5. Three branches towards the zero clip 0 of the power supply are connected to the connecting line connecting diode D2 and resistor R6 with the IGBT gate of the NMOS transistor 5.

The first branch is made by Zener diode ZD2, the second branch is made by resistor R7 and the third branch is formed by Zener diode ZD3 and capacitor C3 connected in series. The connecting line between Zener diode ZD3 and capacitor C3 is connected onto the positive clip+U of the power supply and onto the source electrode of the NMOS transistor 5 through the resistor R8. The Zener diode ZD4 is connected between the source electrode of the NMOS transistor 5 and zero clip 0 of the power supply.

EXAMPLE 2

In this example according to FIGS. 3 to 7 the power voltage is led from the outside source to the generator onto the block of capacitors (CE1-CE4) through the diode (D4) and protective resistor (R18). The diode and the resistor protect the source against sudden changes in voltage, against overshoots on the regulator of voltage. The capacitors are connected in series and in parallel. DC voltage is led from there to the input of the power block. The voltage is switch by power IGBT transistors 5 (IGBT1 and IGBT2) pursuant to TTL signal from its own frequency generator 1 or from the external source of the TTL signal led through the exciter 4. The IGBT transistors 5 are protected at the input (ZD2) and output (Transil 3) against impulse overvoltage. The voltage is led to the magnetron 6 through stabilizing non-inductive resistors 7 (R12 and R13). The power level is protected against short-term impulse short-circuits by the snubber (R10, 11+C4).

Figure 3:
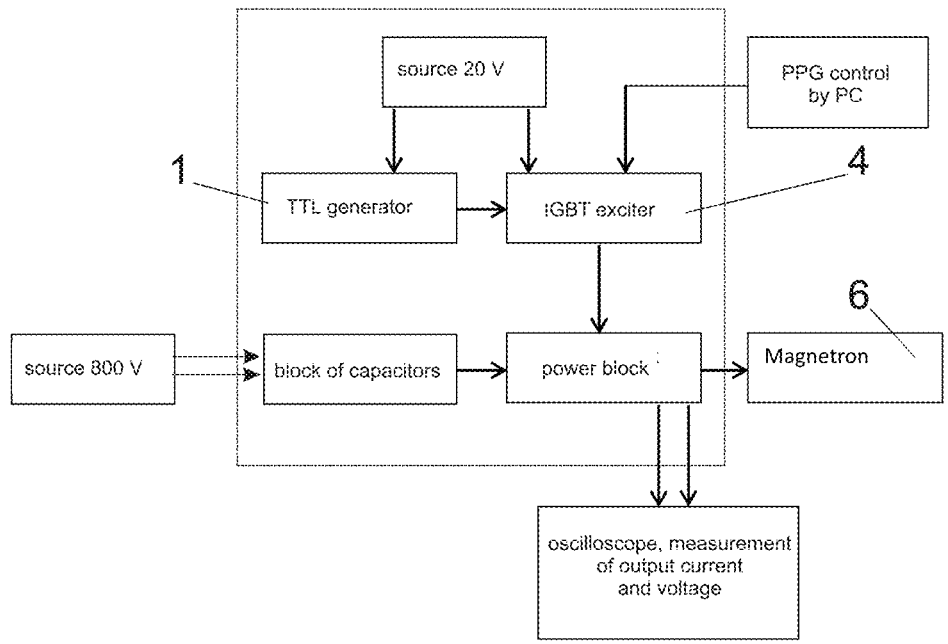
FIG. 3 is a simplified block scheme of the connection of the pulse plasma generator according to the second example of realization.
Figure 4:
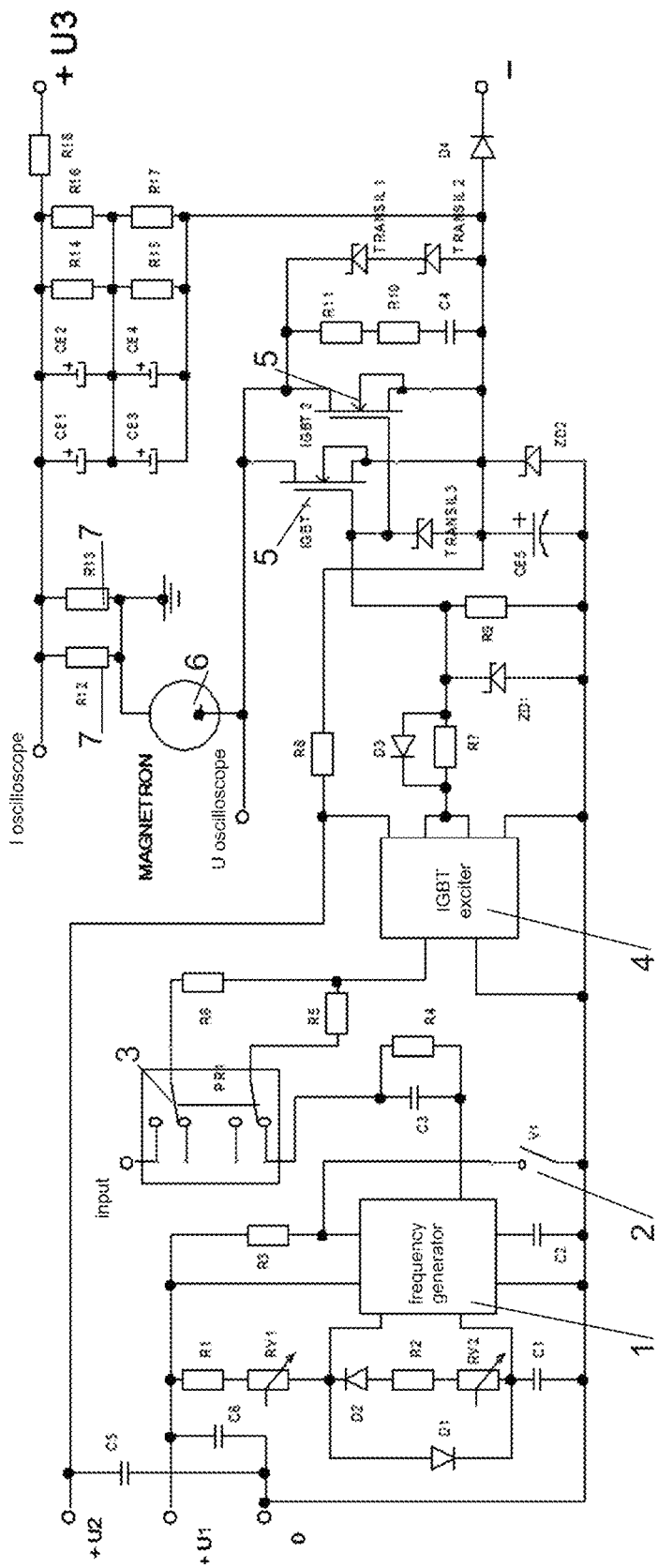
FIG. 4 shows the electric scheme of the connection.
Figure 5:
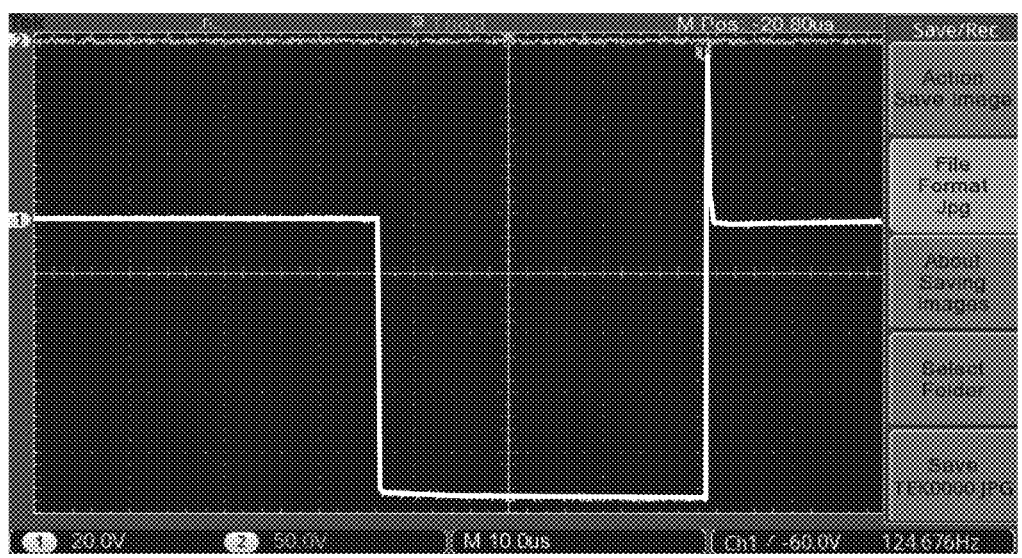
FIG. 5 shows a course of the voltage with a load during the testing of the connection.

The generator according to this example with schemes pursuant to FIGS. 3 and 4 has subsequent features:

the input voltage: 230 V AC/50 Hz for low-voltage control the input voltage: 880 V DC, 0,6 A for supply of the performance part the output current of the voltage pulse: 90 A (160A for 1 minute at max.)

pulse width: 22-240 µs gap width: 5,2-33 ms frequency of the output voltage pulse: 30-192 Hz pulse/gap ratio: 22-1500 performance in pulse: 80 kW; short-term: 140 kW

The generator was first tested under performance resistance.

Figure 6:
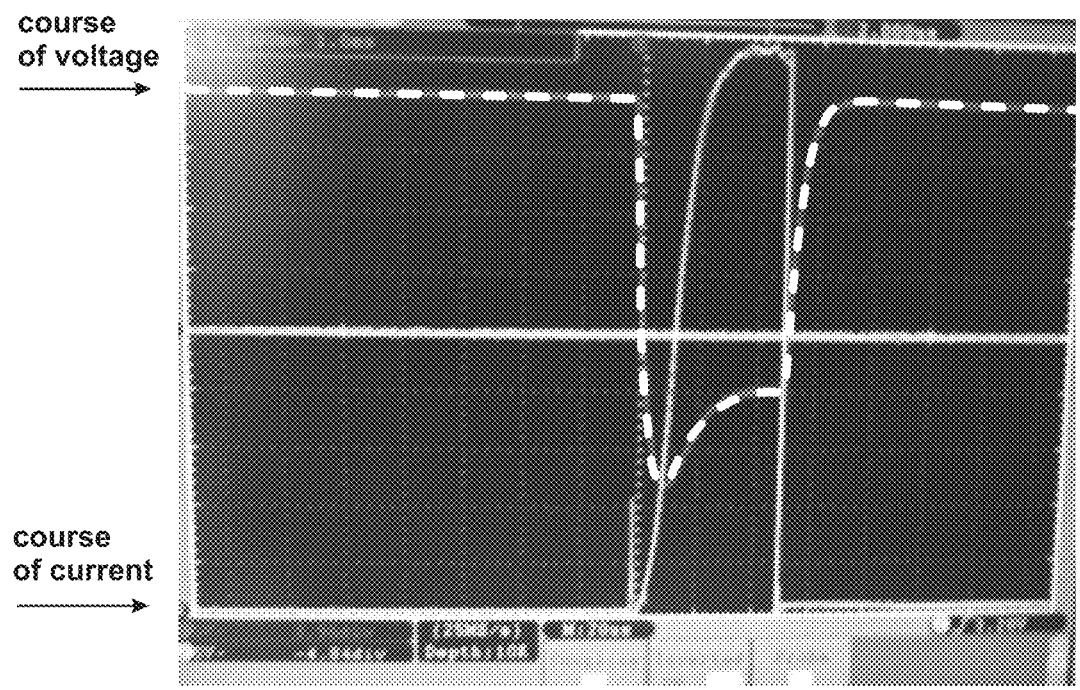
FIG. 6 shows a course of voltage and current during the non-reactive Ar discharge on the Cr target. The course of the voltage is delimited by the dashed line.

The course of the voltage during testing or application is completely clear, without any interference or noise. The leading edge corresponds to the speed of the switching of IGBT transistors. The measurement of the performance parameters took place on the sputtering magnetron 6 with Cr target with diameter 10 cm. The process parameters of the deposition, which lasted ca. 30 minutes in the non-reactive mode and then ca. 30 minutes in the reactive mode, were following:

Non-reactive sputtering—flow Ar=130 sccm; operative pressure p=0.53 Pa with background pressure $5 \times 10^{-3}$ Pa; the pulse length 25-70 µs; the current in pulse 45-95 A, short-term 160 A, during power supply voltage 780 V and current 600 mA; the repetition frequency 30-180 Hz. Onset of current in non-reactive mode is delayed by ca. 7 µs (FIG. 6).

Figure 7:
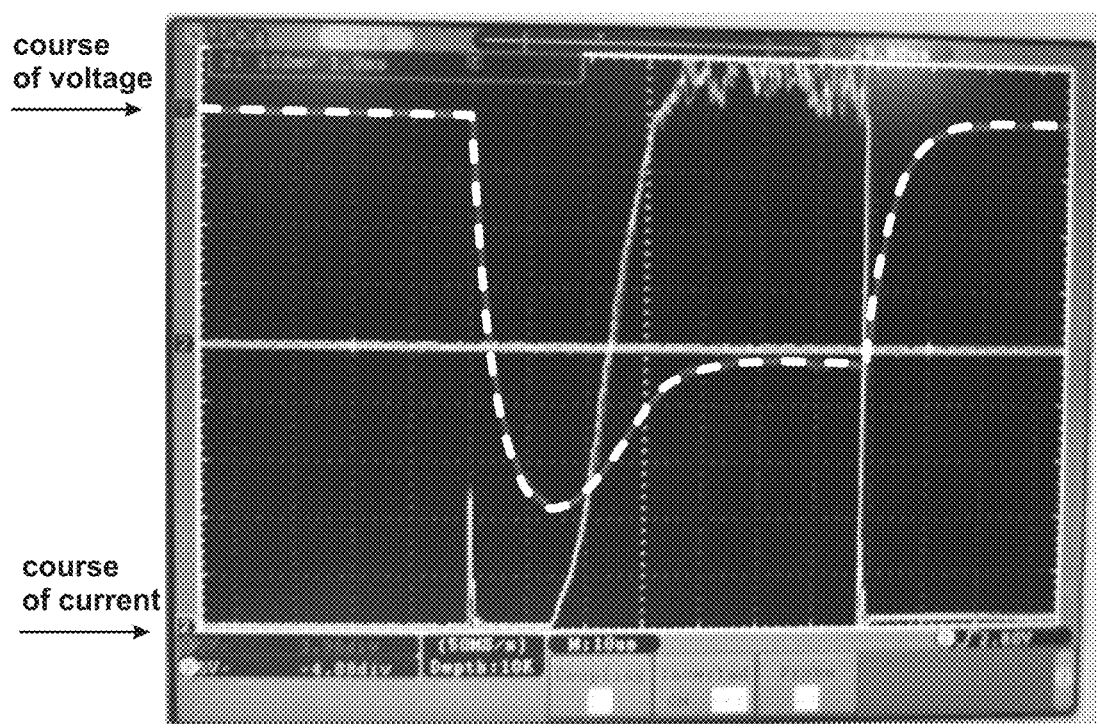
FIG. 7 shows a course of voltage and current during the reactive discharge in the mixture of Ar and N on Cr target. The course of the voltage is delimited by the dashed line.
Figure 8:
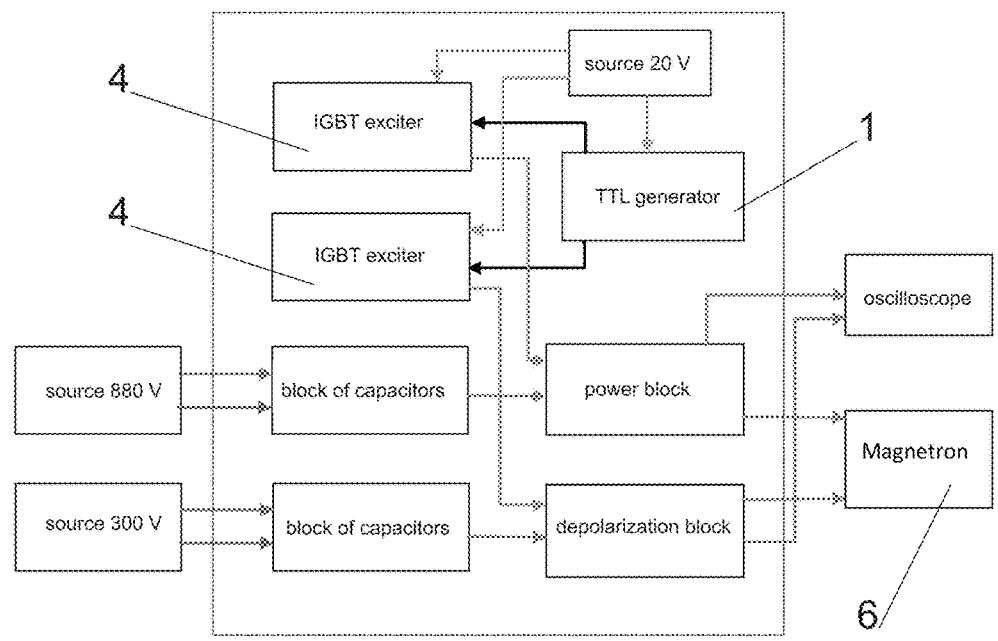
FIG. 8 is a simplified block scheme of the connection of the bipolar pulse plasma generator.
Figure 9:
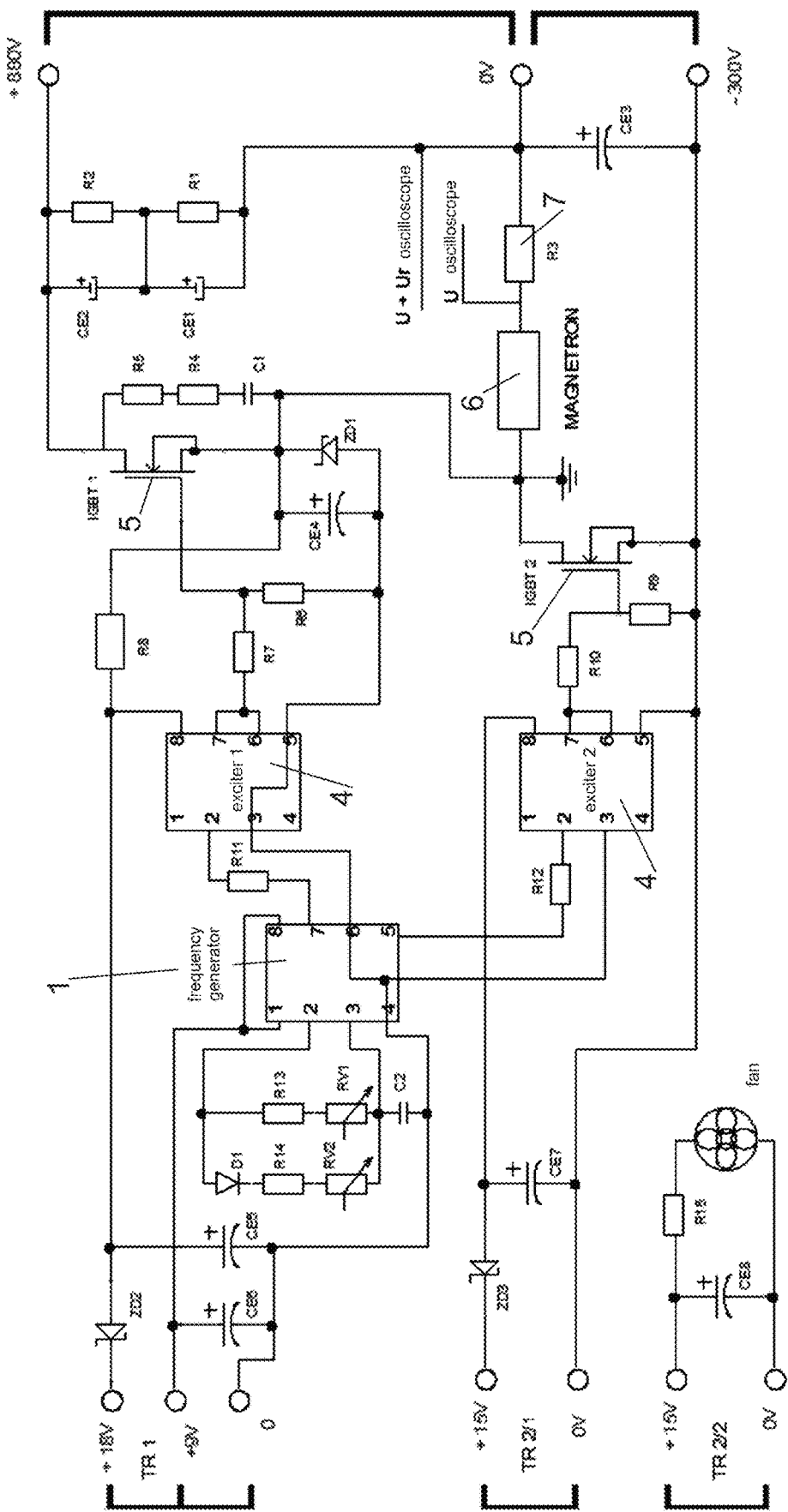
FIG. 9 shows the electric scheme of the connection of the bipolar pulse plasma generator.
Figure 10:
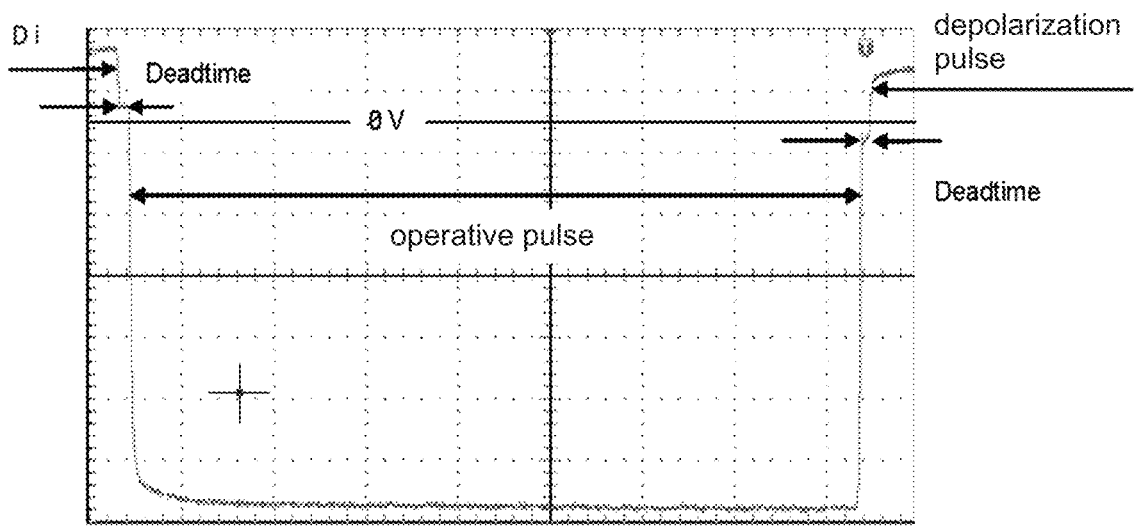
FIG. 10 shows the course of the voltage on the load.

Reactive sputtering—flow Ar=35 sccm, N2=32 sccm; operative pressure p=0.52 Pa with background pressure $5 \times 10^{-3}$ Pa; the pulse length 45-110 µs; the current in pulse 45-95 A, short-term 155 A, during power supply voltage 750 V and current 600 mA; the repetition frequency 40-190 Hz. Onset of current in reactive mode is delayed by ca. 10 µs (FIG. 7).

EXAMPLE 3

Bipolar pulse plasma generator pursuant to FIGS. 8 to 12 is preferably used for the increase of the quality of the sputtered layer.

In bipolar pulse plasma generator, the power voltage is led from the outside source into the power block through the block of capacitors CE1 and CE4. The stability of their voltages is ensured by resistors R1 and R2. The depolarization voltage 300 V is led from the outside source through the capacitor CE3 into the depolarization block. The voltages are switch by power IGBT transistors 5 IGBT1 and IGBT2, pursuant to the TTL signal from the frequency generator 1 led through the exciter 4. The power level is protected against short-term impulse short-circuits by the snubber with resistors R4 and R5 and capacitor C4. The voltage is led to the magnetron 6 through stabilizing non-inductive resistor 7 (R3).

The generator according to this example has subsequent features:

the input voltage: 230 V AC/50 Hz for low-voltage control the input voltage: 880 V DC, 0,4 A for supply of the performance part the input voltage: 3000 V DC, 0,2 A for supply of the depolarization part the output current of the voltage pulse: 120 A (160A for 1 minute at max.)

operative pulse width: 5-70 µs depolarization pulse width: 0,33-1.8 ms width of the gap between pulses (deadtime): 1 µs frequency of the output voltage pulse: 535-2985 Hz pulse/gap ratio: 4,7-360 performance in pulse: 100 kW; short-term: 140 kW

The generator was first tested with performance resistance. The course of the voltage was completely clear, without any interference or noise. The leading edge corresponds to the speed of the switching of IGBT transistors 5. The gap between pulses was maintained both during the positive and negative change in the voltage.

The tests of the bipolar pulse plasma generator were realized on the sputtering device with Cr target with diameter 10 cm.

Figure 11:
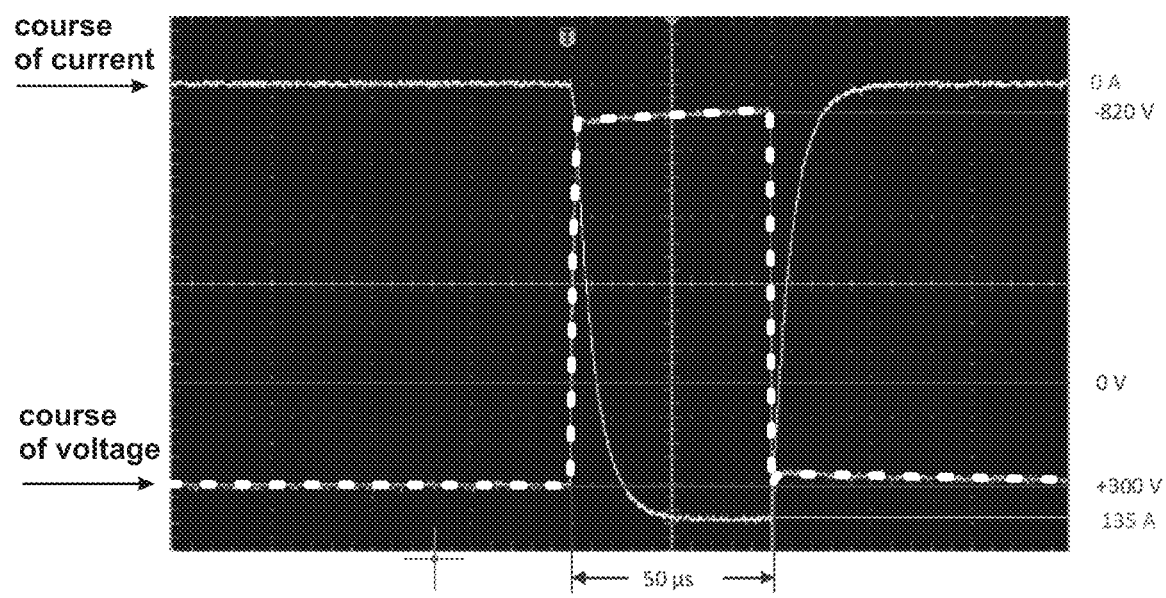
FIG. 11 shows a course of voltage and current during non-reactive discharge in Ar on Cr target. The course of the voltage is delimited by the dashed line.

The process parameters of the deposition, which lasted ca. 35 minutes in the non-reactive mode and then ca. 45 minutes in the reactive mode, were following:

Non-reactive sputtering—flow Ar=135 sccm; operative pressure p=0.55 Pa with background pressure $5 \times 10^{-3}$ Pa; the pulse length 15-70 µs; the current in pulse 25-120 A, short-term 160 A, during power supply voltage 820 V and current 400 mA. The power supply voltage of the depolarization level was 10-300 V with current up to 15 mA; the repetition frequency 600-2985 Hz. Onset of current in non-reactive mode is delayed by ca. 7 µs (FIG. 11).

Figure 12:
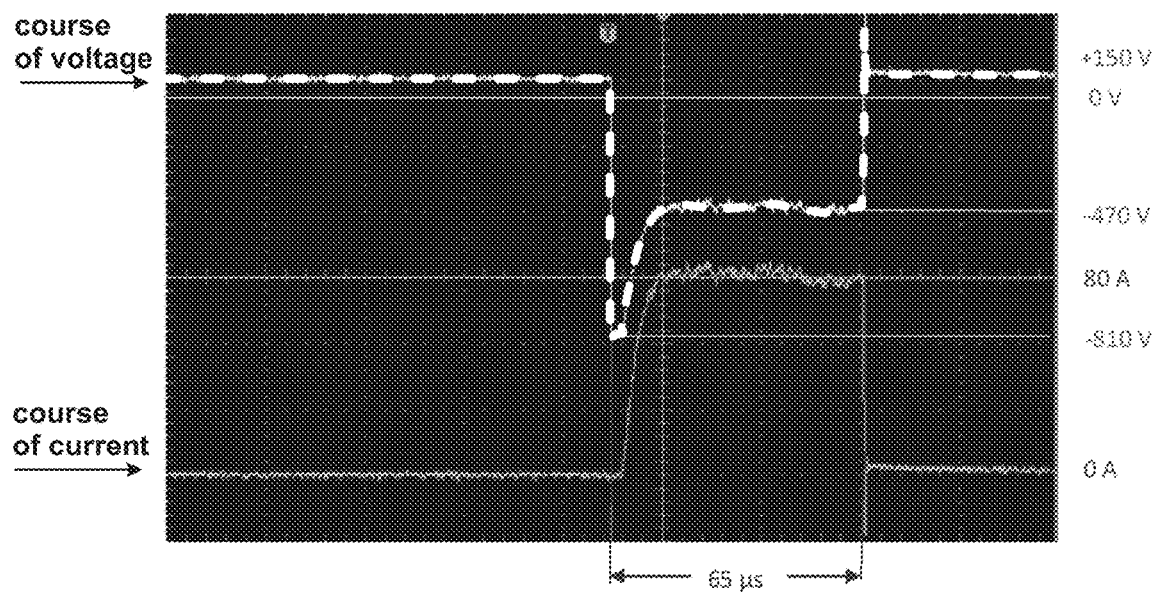
FIG. 12 shows a course of voltage and current during reactive discharge in Ar and N on Cr target. The course of the voltage is delimited by the dashed line.
Figure 13:
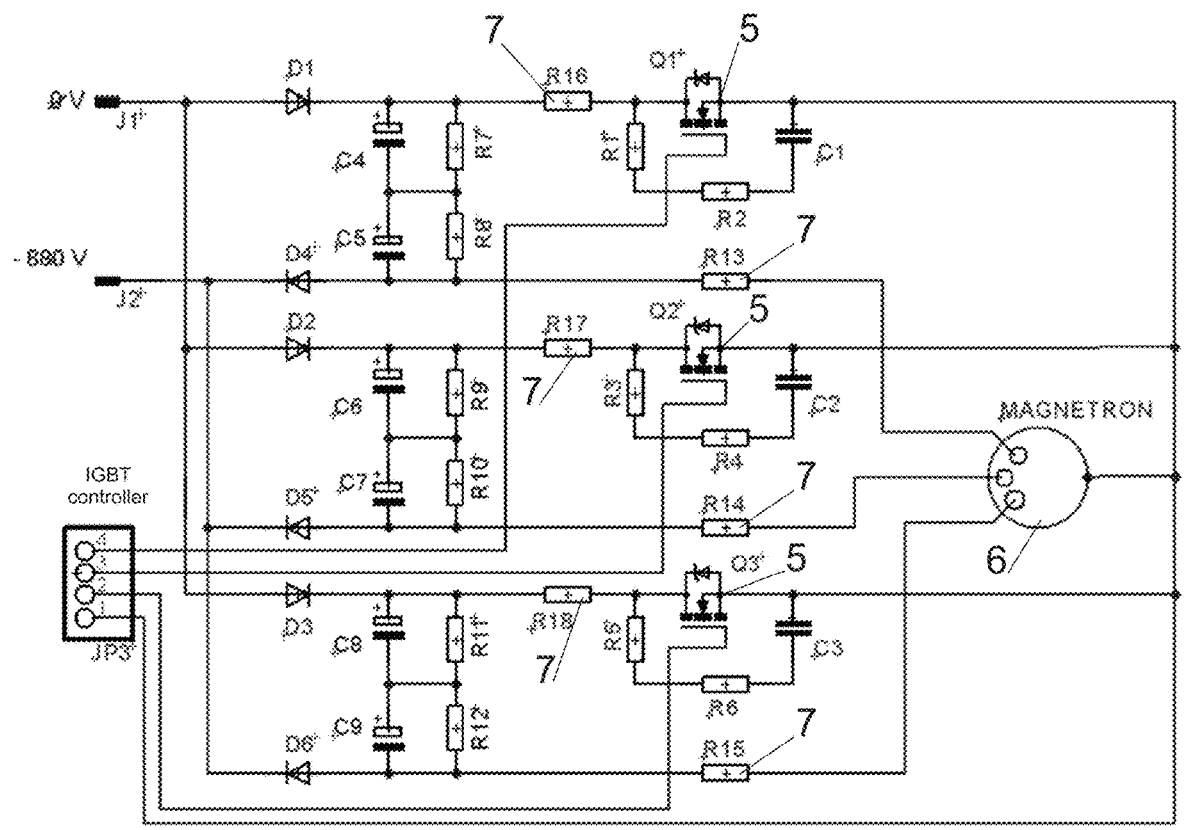
FIG. 13 shows a scheme of connection of the power block of the tricircular pulse plasma generator.
Figure 14:
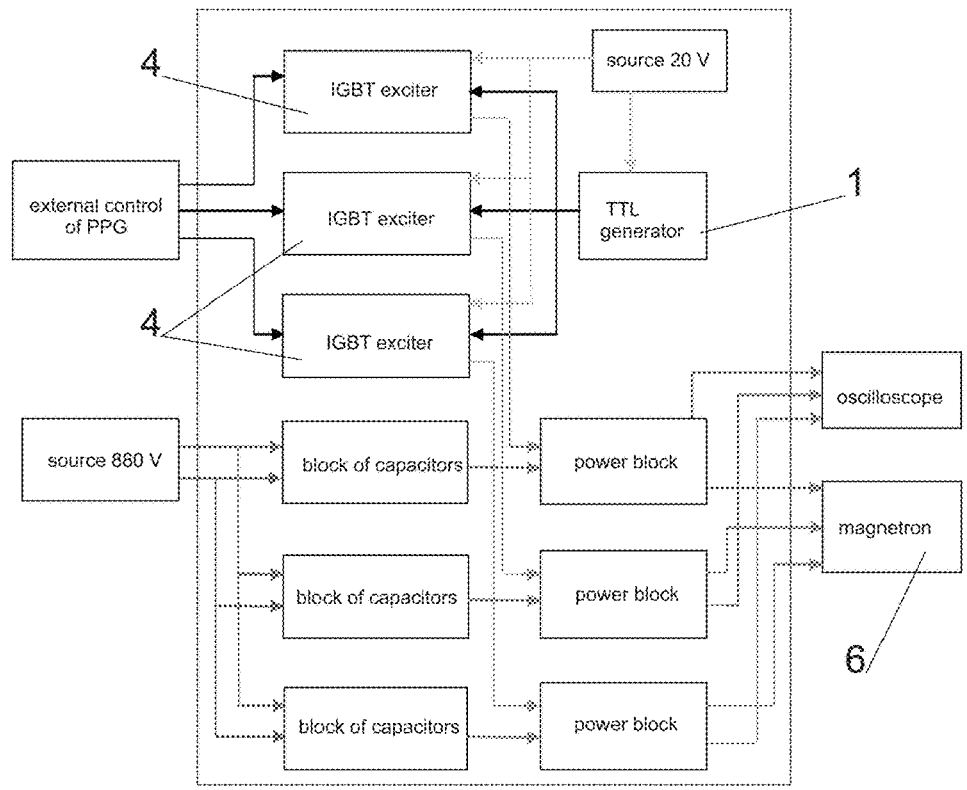
FIG. 14 shows a block scheme of the tricircular pulse plasma generator
Figure 15:
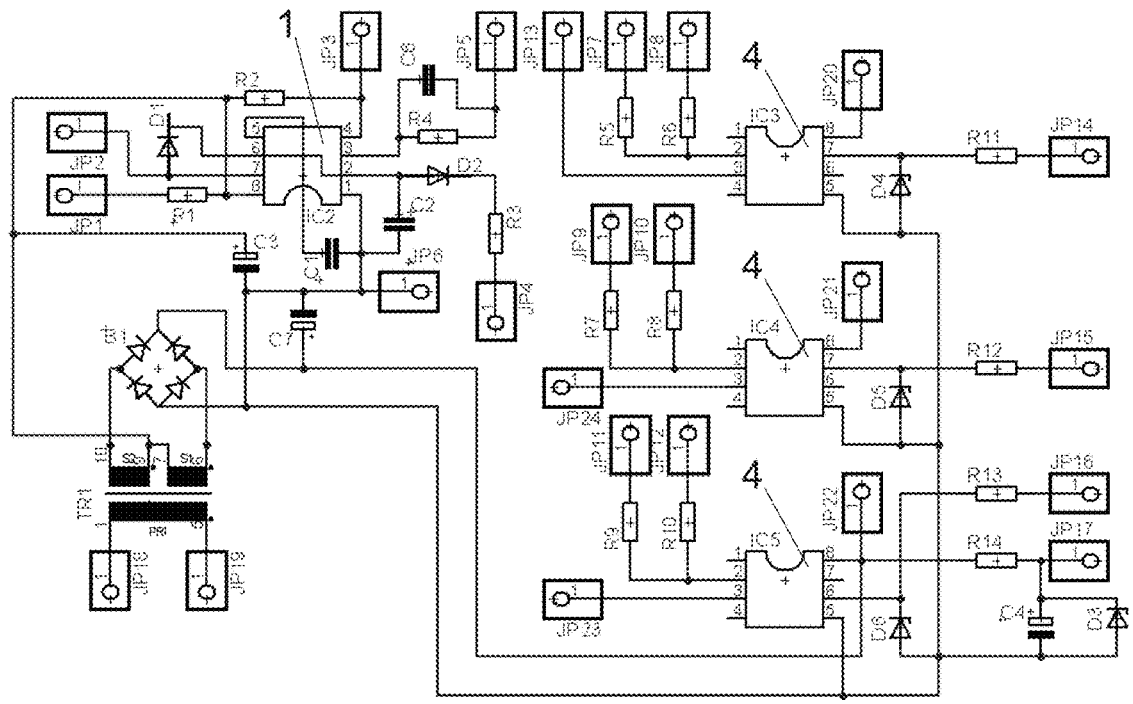
FIG. 15 is an electric scheme of the frequency generator and exciters.
Figure 16:
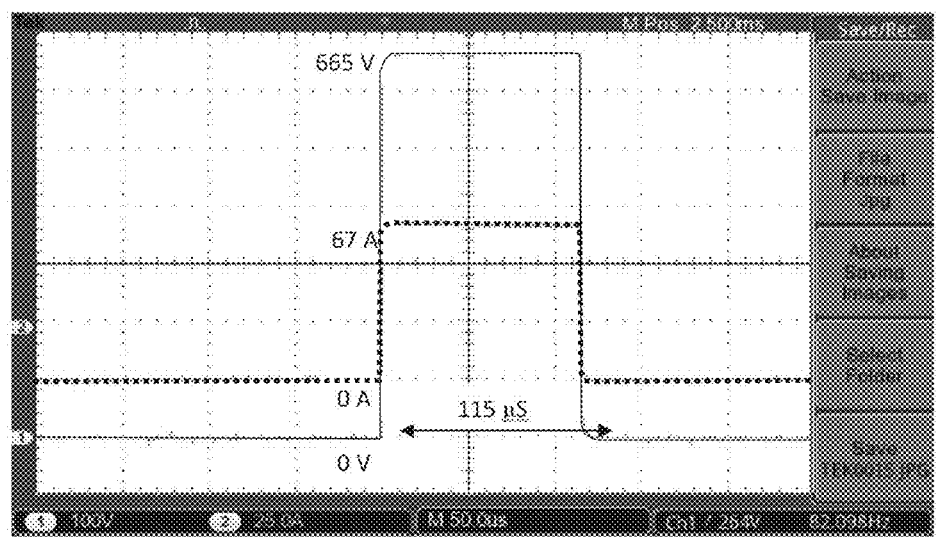
FIG. 16 shows a course of the voltage and current on the loads. The course of the voltage is delimited by dotted line.

Reactive sputtering—flow Ar=45 sccm, N2=22 sccm; operative pressure p=0.53 Pa with background pressure $5 \times 10^{-3}$ Pa; the pulse length 5-70 µs; the current in pulse 15-105 A, short-term 155 A, during power supply voltage 810 V and current 380 mA. The power supply voltage of the depolarization level was 10-300 V with current up to 15 mA;

the repetition frequency 535-2500 Hz. Onset of current in reactive mode is delayed by ca. 9 μs (FIG. 12).

EXAMPLE 4

Tricircular pulse plasma generator according to the FIGS. 13 to 16 allows to produce a film from three different substrates at the same time, or by subsequent switching on of the generators it can produce multilayer films.

The power voltage 880 V is led from the outside source onto the capacitors CE4-CE9 through the separation diodes D1-D6. The diodes ensure mutual independence of all performance circuits. Thanks to them it suffices that all circuits are supplied by power by one voltage source only. The stability of the voltages in the capacitors is ensured by the separation resistors R7-R12. The voltages are switched by the power IGBT transistors 5 Q1-Q3, pursuant to the TTL signal from the own or external frequency generator 1. Each power level is protected against short-term impulse short-circuits by snubber R1, R2+C1; R3, R4+C2 and R5, R6+C3. The voltage is led to the magnetron 6 through stabilizing non-inductive resistors 7 (R13-R18).

IGBT transistors 5 of "High speed 3 technology" class with high switching speed were used for the switching of the power voltage in this example. This IGBT transistor 5 is resistant against interference as well as short-term short-circuits. Power stabilizing non-inductive resistors 7 with Ayrton-Perry-type were used for the stabilization of the plasma discharge.

Tricircular pulse plasma generator according to this example has following features:
the input voltage: 230 V AC/50 Hz for low-voltage control
the input voltage: 880 V DC, 1,2 A for supply of the performance part
the output current of the voltage pulse: 150 A (3×50 A), 240A for 1 minute at max.
operative pulse width: 50-500 μs
width of the gap between pulses: 5-14 ms
frequency of the output voltage pulse: 72-200 Hz
pulse/gap ratio: 1:10 to 1:280
performance in pulse: 135 kW (3×45 kW); short-term: 200 kW The excitation of IGBT transistors 5 is ensured by the integrated circuits IC3—IC5. Their excitation signal can be controlled by own frequency generator 1 (IC2) or by connected external frequency generator. The changeover switches on the control panel allow for independent switching of the control or turning off of each of the circuits.

Tricircular pulse plasma generator was tested at the performance resistance 10Ω. The course of the current and voltage was completely clear, without any interference or noise. The leading edge corresponds to the speed of the switching of the IGBT transistors.

The data measured in one circuit:
pulse voltage: 665 V
pulse current: 67 A
pulse length: 115 μs
pulse gap: 12 ms
pulse/gap ratio: 1:106
used power: 540 W
output power: 420 W
pulse power: 44.6 kW.

INDUSTRIAL APPLICABILITY

Industrial applicability of the invention is obvious. The connection of the plasma generator of high-performance pulse discharge mainly for magnetron sputtering can be applied, for example, during preparation of thin layers or films.

LIST OF POSITIONS AND SYMBOLS

1—frequency generator
2—cut off switch
3—changeover switch
4—exciter (driver)
5— transistor
6—magnetron
7— stabilizing non-inductive resistor
MEMS-Micro-Electro-Mechanical Systems
IGBT-Insulated Gate Bipolar Transistor
NMOS-Field effect transistor with gate oxide layer (MOSFET subtype)
D— diode
R— resistor
C— capacitor
ZD— Zener diode
TTL-Transistor-Transistor Logic
PPG— pulse plasma generator

The invention claimed is:

1. A connection of a plasma generator of a high-performance pulse discharge for a magnetron sputtering comprising:
a transistor (5),
an exciter (4) of the transistor (5) controlled by a frequency generator (1), and/or a programmable unit,
a power source of a voltage
a unit with capacitors,
wherein the power source of the voltage is connected with the transistors (5) through the unit with capacitors,
wherein a power stabilizing non-inductive resistor (7) is included in a power supply branch for a magnetron (6) with the transistor (5).

2. The connection of the plasma generator of according to claim 1, wherein the power stabilizing non-inductive resistor (7) is the resistor wound by a wire with an Ayrton-Perry-type winding and/or the resistor with a low value of a parasitic inductance on a basis of thin layers.

3. The connection of the plasma generator according to claim 1, wherein a value of an impedance of the power stabilizing non-inductive resistor (7) is equal the impedance of a glow discharge in metal gases with a margin of error 25% or it is larger than the impedance of the glow discharge in the metal gases.

4. The connection of the plasma generator according to claim 1, wherein electronic control circuits are connected to an IGBT gate of the NMOS transistor (5) and a first branch with the resistors and the capacitor, a second branch with a diode and the third branch with three overvoltage diodes are inserted in parallel between a source electrode and a drain electrode of the NMOS transistor (5).

5. The connection of the plasma generator according to claim 4, wherein compensation capacitors and compensation resistors are inserted behind a power protective resistor between a positive and a negative clip of a power supply.

6. The connection of the plasma generator according to claim 1, wherein a protective diode, a diode for the stabilizing resistors and the resistor connected onto the negative clip of the power supply are inserted in the power supply branch for the magnetron (6).

7. The connection of the plasma generator according to claim 6, wherein the protective diode is inserted in a conductive direction behind the power protective resistor in the power supply branch for the magnetron (6); the resistor is connected between the source electrode of the NMOS transistor (5) and the negative clip of the power supply; the diode is inserted in the conductive direction in series with parallel combination of the first stabilizing resistor and the second stabilizing resistor between the protective diode and the magnetron (6).

8. The connection of the plasma generator according to claims 1, wherein the electronic control circuits of the gate of the transistor (5) include the frequency generator (1) with a cut-off switch (2) and with support elements and they further include an exciter (4) with support elements, whereby, preferably, a changeover switch (3) with a second input of the programmable unit is inserted between them.

9. The connection of the plasma generator according to claim 1, wherein the power voltage from an outside source is led onto a block of the capacitors through the diode and the protective resistor and, further, the voltage is led onto the input into a power block with two power IGBT transistors (5) for a switching pursuant to a signal from the frequency generator (1) and/or pursuant to an external source of signal led in through the exciter (4).

10. The connection of the plasma generator according to claim 9, wherein the capacitors in the block of the capacitors are connected in series and in parallel.

11. The connection of the plasma generator according to claim 9, wherein the voltage is led onto the magnetron (6) through the two power stabilizing non-inductive resistors (7).

12. The connection of the plasma generator according to claim 9, wherein the IGBT transistors (5) are protected against overvoltage by Zener diode at the input and by the protective diode at the output.

13. The connection of the plasma generator according to claim 9, wherein a power level is quipped by a snubber with the resistors and the capacitors.

14. The connection of the plasma generator according to claim 1, wherein further includes a depolarization block which is connected with an outer source of the opposite voltage through the capacitor.

15. The connection of the plasma generator according to claim 1, wherein the power supply of at least two independent circuits of the magnetron (6), whereby each power supply circuit has at least one power stabilizing non-inductive resistor (7).

16. The connection of the plasma generator according to claim 15, further including three independent power circuits of the magnetron (6) with three transistors (5), whereby each power circuit has at least one power stabilizing non-inductive resistor (7), preferably one power stabilizing non-inductive resistor (7) at the input of each power circuit of the magnetron (6) and one power stabilizing non-inductive resistor (7) is at the output of each power supply circuit of the magnetron (6).

17. The connection of the plasma generator according to claim 15, wherein the power voltage is led in from one outside source to the blocks of capacitators through separation diodes.

18. The connection of the plasma generator according to claim 15, wherein each power circuit is equipped by the snubber with the resistors and the capacitors.

* * * * *